(12) United States Patent
Hetzler et al.

(10) Patent No.: US 11,879,720 B2
(45) Date of Patent: Jan. 23, 2024

(54) DEVICE AND METHOD FOR CHARACTERIZING THE SURFACE SHAPE OF A TEST OBJECT

(71) Applicant: Carl Zeiss SMT GmbH, Oberkochen (DE)

(72) Inventors: Jochen Hetzler, Aalen (DE); Holger Jennewein, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 184 days.

(21) Appl. No.: 17/400,486

(22) Filed: Aug. 12, 2021

(65) Prior Publication Data

US 2021/0372781 A1 Dec. 2, 2021

Related U.S. Application Data

(63) Continuation of application No. PCT/EP2019/086881, filed on Dec. 21, 2019.

(30) Foreign Application Priority Data

Feb. 12, 2019 (DE) ...................... 10 2019 201 762.2

(51) Int. Cl.
*G01B 11/02* (2006.01)
*G01B 11/24* (2006.01)
*G03F 7/00* (2006.01)

(52) U.S. Cl.
CPC ...... *G01B 11/2441* (2013.01); *G03F 7/70591* (2013.01)

(58) Field of Classification Search
CPC ............ G01B 11/2441; G01B 9/02039; G01B 9/021; G03F 7/70591; G03F 7/70841;
(Continued)

(56) References Cited

U.S. PATENT DOCUMENTS 6,344,898 B1    2/2002  Gemma et al.
2004/0222383 A1* 11/2004 Kawakami .......... G03F 7/70841
                                                    427/248.1
(Continued)

FOREIGN PATENT DOCUMENTS

DE           19944021 A1    5/2000
DE      102006055070 A1    6/2008
(Continued)

OTHER PUBLICATIONS

Picart, "New Techniques in Digital Holography", published by ISTE ltd and John Wiley & Sons, Inc., (2015), Chapter 6, pp. 219-254.
(Continued)

*Primary Examiner* — Uzma Alam
*Assistant Examiner* — Jonathan Cook
(74) *Attorney, Agent, or Firm* — Edell, Shapiro & Finnan, LLC

(57) ABSTRACT

A device and a method for characterizing the surface shape of a test object. The device for characterizing the surface shape of a test object has a test arrangement (130, 230) for determining the surface shape of a test object (111, 112, 113, 211, 212, 213) using a test wave. The test wave has a wavefront generated by diffraction at a diffractive optical element. The device additionally has a first vacuum chamber (110, 210) and a second vacuum chamber (120, 220), wherein the second vacuum chamber (120, 220) has a magazine for mounting at least two diffractive optical elements (121, 122, 123, 221, 222, 223).

15 Claims, 6 Drawing Sheets

(58) Field of Classification Search
CPC ............. G01M 11/005; G01M 11/025; G01M 11/0271; E21B 23/0412
See application file for complete search history.

(56) References Cited

U.S. PATENT DOCUMENTS

| | | | |
|---|---|---|---|
| 2005/0121144 A1* | 6/2005 | Edo | G03F 7/7075 156/345.32 |
| 2007/0121092 A1 | 5/2007 | Mochizuki et al. | |
| 2009/0031572 A1 | 2/2009 | Boesser et al. | |
| 2009/0237672 A1 | 9/2009 | Doerband et al. | |
| 2010/0014065 A1 | 1/2010 | Gruner et al. | |
| 2014/0320835 A1* | 10/2014 | Fujiwara | G01B 11/24 355/77 |
| 2015/0301455 A1* | 10/2015 | Schlesener | G03F 7/70058 355/67 |
| 2016/0085061 A1 | 3/2016 | Schwab | |
| 2017/0343449 A1* | 11/2017 | Stiepan | G01B 9/021 |
| 2018/0087891 A1* | 3/2018 | Wegmann | G01M 11/0264 |
| 2018/0106591 A1 | 4/2018 | Hetzler et al. | |

FOREIGN PATENT DOCUMENTS

| | | |
|---|---|---|
| DE | 102008000790 A1 | 9/2008 |
| DE | 102007036814 A1 | 2/2009 |
| DE | 102015202676 B4 | 9/2016 |
| DE | 102015209490 A1 | 11/2016 |

OTHER PUBLICATIONS

Smith et al., "Cryogenic optical testing results of JWST aspheric test plate lens", Proc. of SPIE, vol. 8126, Optical Manufacturing and Testing IX, Sep. 27, 2011, 1 pages.
German Office Action with English translation, Application No. 10 2019 201 762.2, dated Sep. 18, 2019, 10 pages.
International Preliminary Report on Patentability, PCT/EP2019/086881, dated Aug. 10, 2021, 17 pages.
International Search Report, PCT/EP2019/086881, dated Apr. 9, 2020, 5 pages.

\* cited by examiner

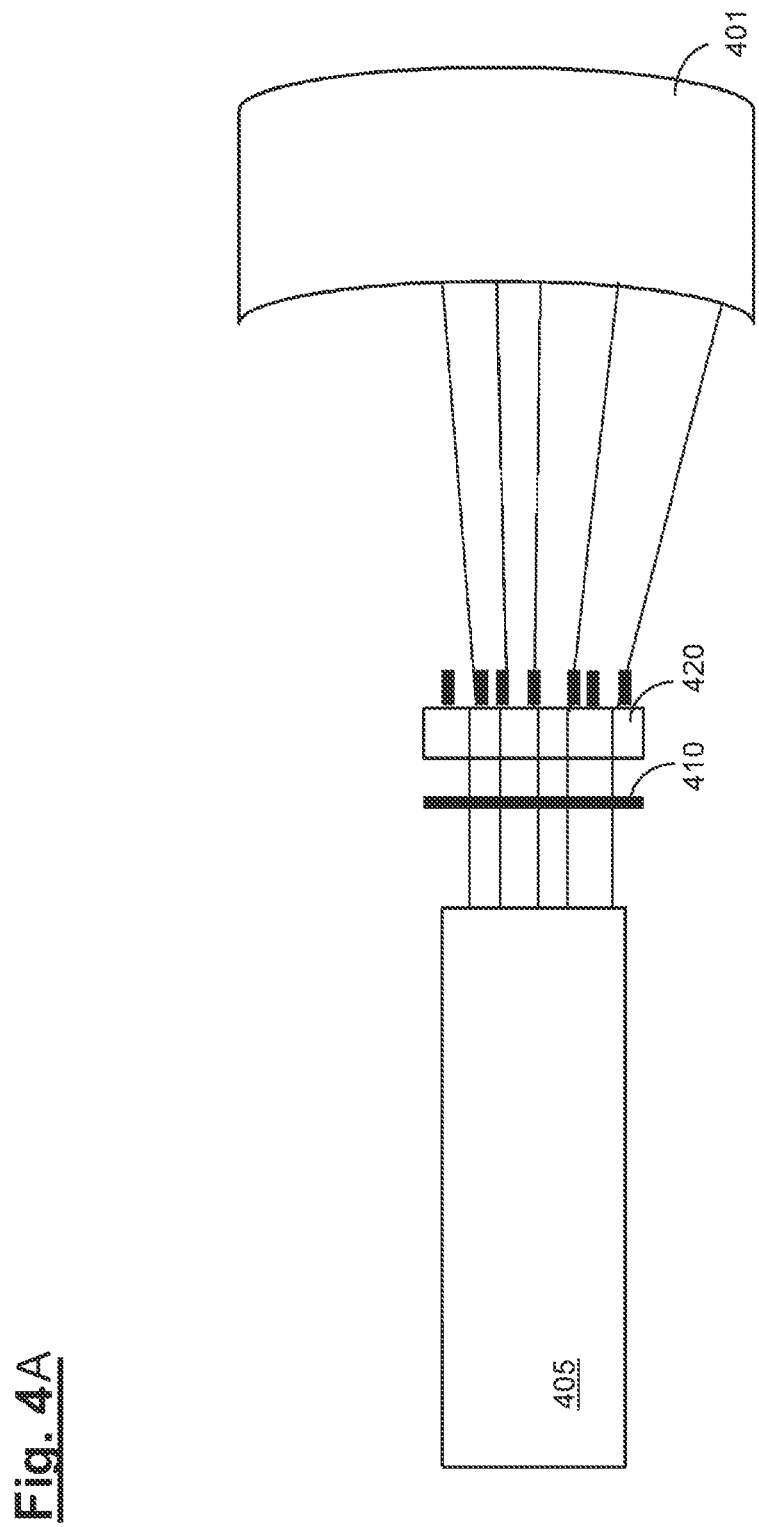

DEVICE AND METHOD FOR CHARACTERIZING THE SURFACE SHAPE OF A TEST OBJECT

CROSS REFERENCE TO RELATED APPLICATIONS

This is a Continuation of International Application PCT/EP2019/086881, which has an international filing date of Dec. 21, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 201 762.2 filed on Feb. 12, 2019.

FIELD OF THE INVENTION

The invention relates to an apparatus and a method for characterizing the surface shape of a test object.

BACKGROUND

Microlithography is used for production of microstructured components, such as integrated circuits or LCDs, for example. The microlithography process is conducted in what is called a projection exposure apparatus, which comprises an illumination device and a projection lens. The image of a mask (=reticle) illuminated by the illumination device is then projected by the projection lens onto a substrate (e.g., a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process, owing to the lack of availability of suitable light-transmissive refractive materials. Typical projection lenses designed for EUV, as known e.g. from US 2016/0085061 A1, may have for example an image-side numerical aperture (NA) in the region of NA=0.55 and image an (e.g., ring-segment-shaped) object field into the image plane or wafer plane.

The increase of the image-side numerical aperture (NA) is typically accompanied by an enlargement of the required mirror areas of the mirrors used in the projection exposure apparatus. This in turn has the consequence that, in addition to manufacturing, testing the surface shape of the mirrors also presents a demanding challenge. In this context, interferometric measuring methods using diffractive optical elements such as, e.g., computer-generated holograms (CGH), in particular, are used for highly precise testing of the mirrors. In this case, it is also known, inter alia, to encode at least one further "calibration functionality" for providing a reference wavefront that serves for calibration or error correction in one and the same CGH in addition to the functionality that is required for the actual test (i.e., the CGH structure that is designed in accordance with the mirror shape for shaping the wavefront that mathematically corresponds to the test object form).

To satisfy the high requirements in respect of accuracy applicable when testing microlithographic EUV mirrors, such interferometric measuring methods are typically carried out under vacuum conditions (with typical pressures of the order of less than 100 mbar, in particular less than 1 mbar). Inter alia, this takes account of the circumstances that, as a consequence of the temperature dependence of the refractive index of, e.g., air, highly accurate closed-loop temperature control with accuracies of the order of 10 mK would be required if the interferometric test arrangement were operated under atmospheric pressure.

However, a further problem occurring in practice when the interferometric mirror testing is carried out under the required, above-described vacuum conditions is that the introduction of optical components into a vacuum chamber is accompanied by surface cooling of the respective optical components as a consequence of the expansion of air that occurs during the evacuation. To avoid temperature-dependent measurement errors caused by thermally induced deformations, it is possible to plan appropriate temperature-control phases. However, such temperature-control phases may require a wait of substantially more than 60 minutes when testing the mirror (in order, for example, to obtain a temperature homogeneity of 4 mK for measuring an EUV mirror with an accuracy of 0.1 nm), as a result of which the throughput obtained in the respective measurement arrangement is undesirably restricted.

The above-described problem is even more serious since different diffractive optical elements or CGHs are generally used to test different test objects or EUV mirrors. This, in turn, results in the overall waiting time being lengthened even further.

With respect to the prior art, reference is made merely by way of example to DE 10 2015 209 490 A1 and DE 10 2015 202 676 B4.

SUMMARY

Against the above background, it is an object of the present invention to provide an apparatus and a method for characterizing the surface shape of a test object which make an increased measurement accuracy possible. It is a further object to at least partly avoid the problems described above with respect to conventional apparatuses and methods.

These objects are addressed and/or achieved by the apparatuses and methods as defined by the independent patent claims set out hereinbelow.

According to one aspect of the invention, an apparatus for characterizing the surface shape of a test object comprises
a test arrangement for determining the surface shape of a test object using a test wave, the test wave having a wavefront produced by diffraction at a diffractive optical element,
a first vacuum chamber, and
a second vacuum chamber,
wherein the second vacuum chamber comprises a supply chamber for storing at least two diffractive optical elements.

In particular, when carrying out interferometric measurements on different test objects (e.g., EUV mirrors), the invention, by providing two vacuum chambers, one vacuum chamber of which has a supply chamber for storing a plurality of diffractive optical elements, is able to ensure that the respective diffractive optical elements (e.g., CGHs) are able to permanently stay in the vacuum. This has the consequence that unwanted lengthy waiting or temperature-control phases become dispensable.

Here, within the meaning of the present application, a "supply chamber" should be understood to mean any storage or bearing apparatus for receiving a plurality of (i.e., at least two) diffractive optical elements.

Moreover, within the meaning of the present application, a vacuum state should be understood to mean preferably a state with a (constant or changing) pressure of less than 100 mbar, in particular less than 1 mbar.

Here, inter alia, the invention takes as a starting point that the problem, as described at the outset, of thermally induced deformations in the case of diffractive optical elements such as, e.g., CGHs (in particular those with substrates made of quartz glass) has critical effects on the measurement accuracy in interferometric measurement applications even in the case of comparatively moderate vacuum conditions (with vacuum pressures, e.g., ranging from 1 mbar to 100 mbar), whereas the thermal behavior of the actual test objects, such as, e.g., EUV mirrors, is comparatively stable in such scenarios—both in comparison with said CGHs and in comparison with use in the actual microlithographic projection exposure apparatus.

Proceeding from this starting point, a change of the respective test objects is undertaken between vacuum pressure and atmospheric pressure for the test objects themselves, but not for the diffractive optical elements or CGHs, in embodiments of the invention.

In this case, the scope of the present invention accepts both increased installation space needs resulting from the storage of a plurality of diffractive optical elements in vacuo as well as an increased degree of automation, in particular for adjusting the respective diffractive optical elements or CGHs in the interferometric test arrangement. These drawbacks, however, in return, produced the sought-after high throughput in the test arrangement by avoiding the lengthy temperature-control phases described at the outset.

According to one embodiment, the second vacuum chamber is configured to permanently maintain a vacuum state during the operation of the apparatus.

According to one embodiment, the first vacuum chamber is configured to alternate between a state with atmospheric pressure and a vacuum state during the operation of the apparatus.

According to one embodiment, the apparatus comprises a first transporting device for transporting a test object from an outer region into the first vacuum chamber.

According to one embodiment, the test arrangement is arranged in the second vacuum chamber.

According to one embodiment, the apparatus comprises a second transporting device for transporting one test object in each case from the first vacuum chamber into the second vacuum chamber.

According to a further embodiment, the test arrangement is arranged in the first vacuum chamber.

According to one embodiment, the first vacuum chamber and the second vacuum chamber are configured to the end of the first vacuum chamber receiving a respective diffractive optical element from the second vacuum chamber under vacuum conditions.

According to one embodiment, the apparatus comprises an exchange mechanism for exchanging the diffractive optical element respectively situated in the test arrangement.

According to one embodiment, the diffractive optical elements are computer-generated holograms (CGH).

According to one embodiment, the diffractive optical elements contain quartz glass ($SiO_2$).

According to one embodiment, the test objects are optical elements, in particular microlithographic optical elements.

According to one embodiment, the test objects are mirrors, in particular mirrors designed for operation under EUV conditions.

The invention further relates to a vacuum chamber system for use in an apparatus having the above-described features, and to a method for characterizing the surface shape of a test object using an apparatus having the above-described features.

Further configurations of the invention can be gathered from the description and the dependent claims.

The invention is explained in greater detail below on the basis of exemplary embodiments illustrated in the accompanying Figures.

BRIEF DESCRIPTION OF THE DRAWINGS

In the Figures:

FIGS. 4A and 4B show respective schematic illustrations of a further possible configuration of an interferometric test arrangement, where FIG. 4A shows an interferometer generally and FIG. 4B shows the interferometer more specifically.

DETAILED DESCRIPTION

Figure 5:
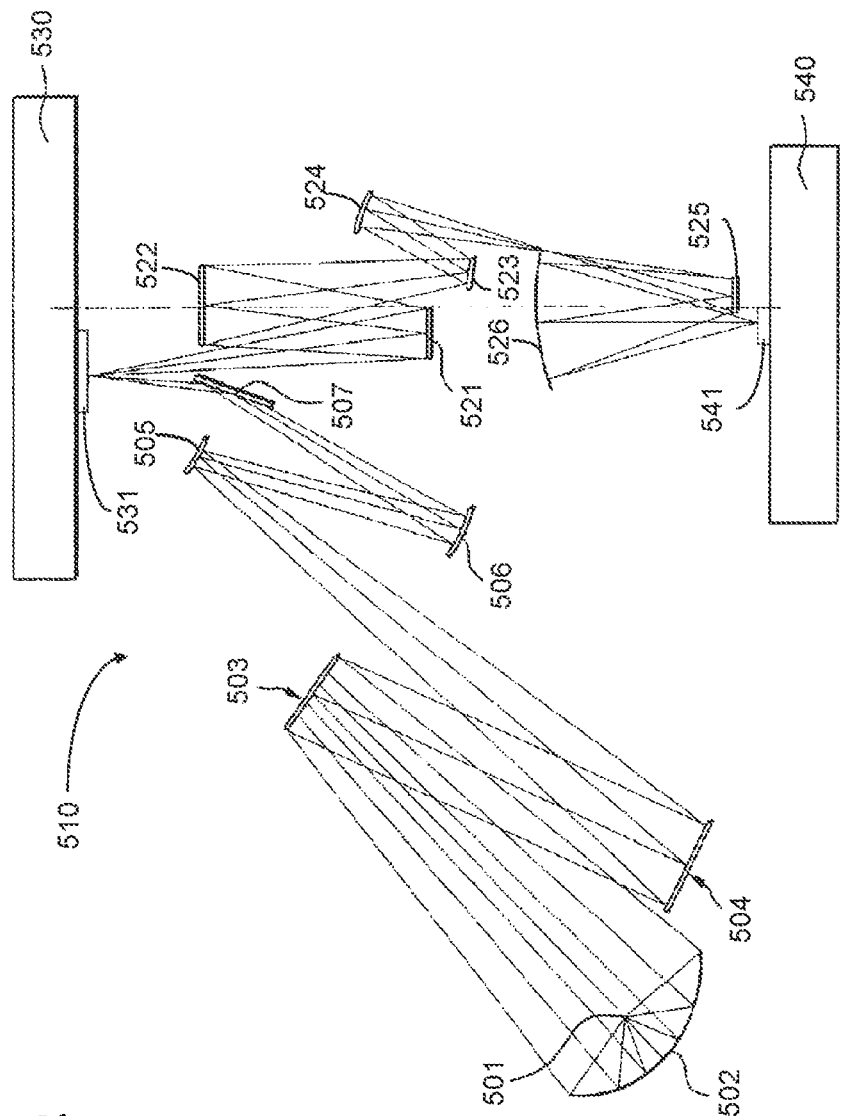
FIG. 5 shows a schematic illustration of a projection exposure apparatus designed for operation with extreme ultraviolet (EUV) radiation.

FIG. 5 firstly shows a schematic illustration of an exemplary projection exposure apparatus which is designed for operation in EUV and which comprises mirrors which can be tested by an apparatus according to the invention.

According to FIG. 5, an illumination device in a projection exposure apparatus 510 designed for EUV comprises a field facet mirror 503 and a pupil facet mirror 504. The light from a light source unit comprising a plasma light source 501 and a collector mirror 502 is directed at the field facet mirror 503. A first telescope mirror 505 and a second telescope mirror 506 are arranged in the light path downstream of the pupil facet mirror 504. A deflection mirror 507 is arranged downstream in the light path, said deflection mirror directing the radiation that is incident thereon at an object field in the object plane of a projection lens comprising six mirrors 521-526. At the location of the object field, a reflective structure-bearing mask 531 is arranged on a mask stage 530, said mask being imaged with the aid of the projection lens into an image plane in which a substrate 541 coated with a light-sensitive layer (photoresist) is situated on a wafer stage 540.

The test object which is tested in an apparatus according to the invention as described below can be, e.g., any mirror of the projection exposure apparatus 510.

Embodiments of the invention will be described below with reference to the schematic illustrations of FIG. 1 and FIG. 2.

Figure 1:
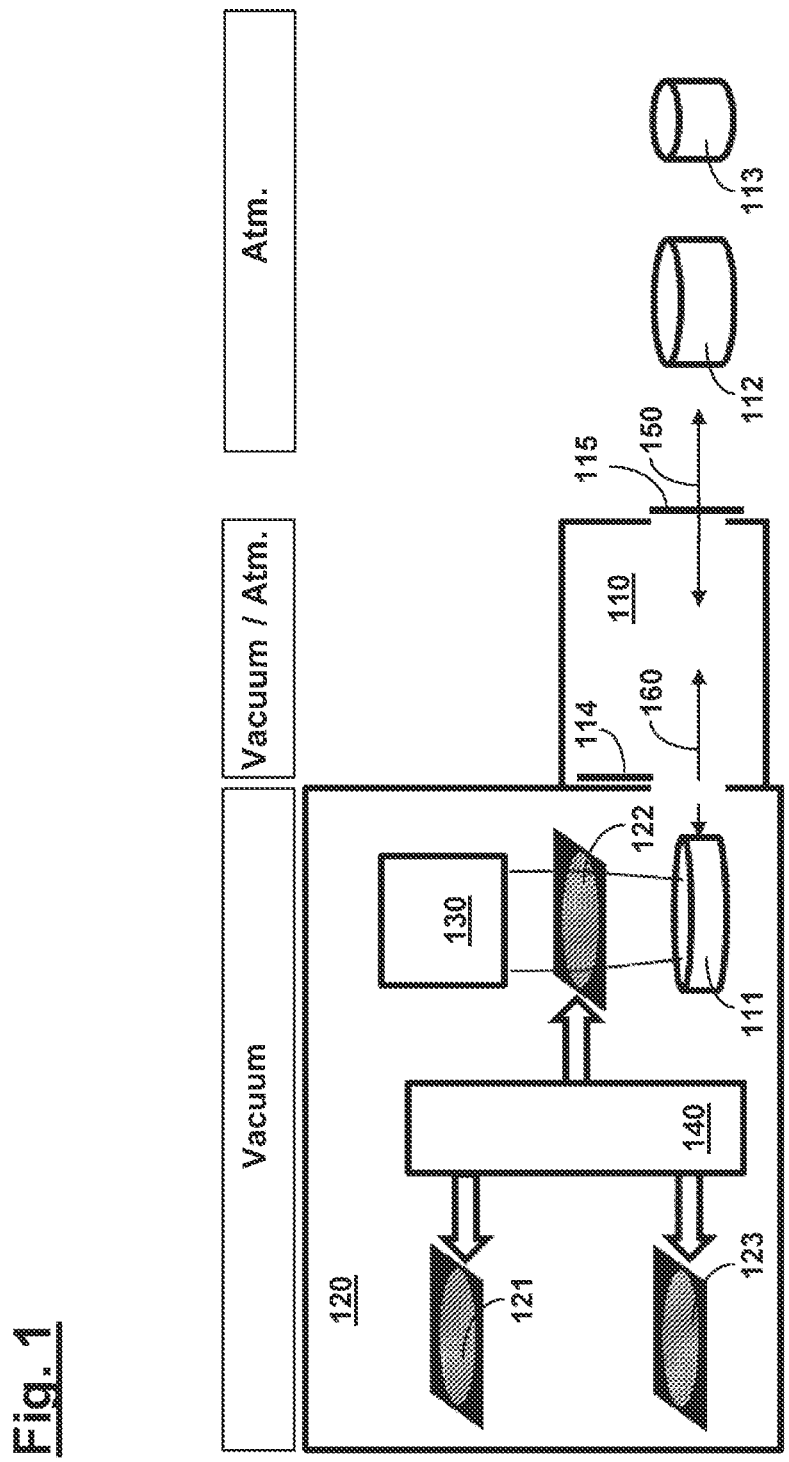
FIGS. 1 and 2 show respective schematic illustrations for explaining a first (FIG. 1) and a second (FIG. 2) exemplary embodiment of the present invention.
Figure 2:
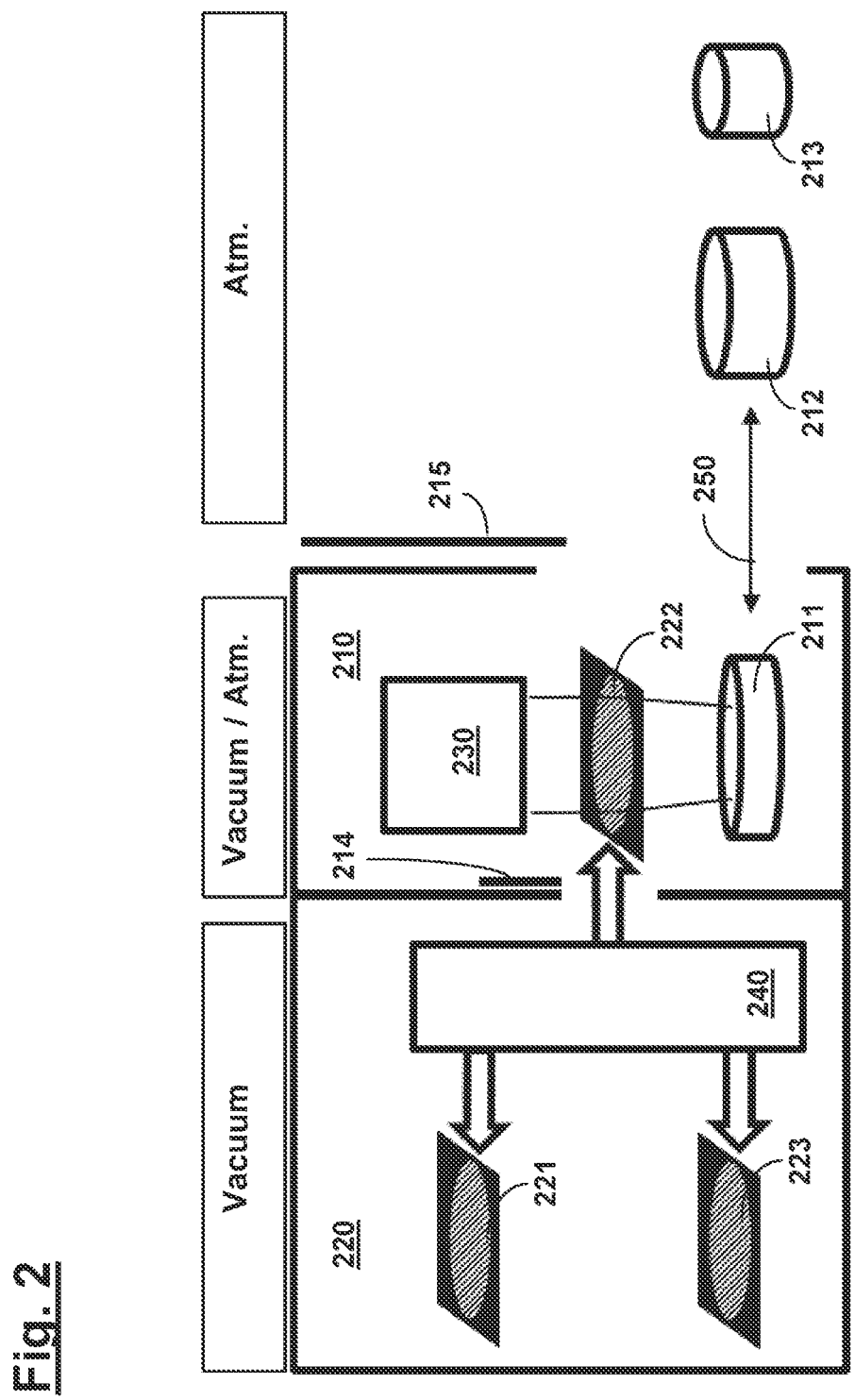

What is common, inter alia, to the embodiments of FIG. 1 and FIG. 2 is that the apparatus according to the invention for characterizing the surface shape of a test object such as, e.g., an EUV mirror comprises a first vacuum chamber (denoted by "110" and "210", respectively) and a second vacuum chamber (denoted by "120" and "220", respectively). The second vacuum chamber 120, 220 has a supply chamber (not illustrated in detail in FIGS. 1-2) for storing a plurality of diffractive optical elements. These diffractive optical elements are denoted by 121, 122, 123, . . . and 221, 222, 223, . . . , respectively. The number of elements stored depends on design considerations and can be set, in principle, to any desired number.

Here, said second vacuum chamber 120 and 220, respectively, is configured in each case to maintain vacuum conditions (e.g., with vacuum pressures of less than 100 mbar, in particular less than 1 mbar) essentially permanently. The first vacuum chamber 110 and 210, respectively, is configured, on the other hand, to alternate between atmospheric pressure and vacuum conditions, as described below.

In the embodiment of FIG. 1, a test arrangement 130 for determining the surface shape of one test object 111, 112, 113, . . . in each case is situated in the second vacuum chamber 120. Possible configurations of such a test arrangement will still be described with reference to FIG. 3 and FIGS. 4A and 4B.

Moreover, according to FIG. 1, the first vacuum chamber 110 is configured as an airlock chamber with corresponding airlocks 114, 115, through which different test objects 111, 112, 113, . . . can be transferred from an outer region, which is under atmospheric pressure, into the second vacuum chamber 120, and in the reverse direction. According to FIG. 1, to this end, two transporting devices 150, 160 (symbolized by double-headed arrows) are provided in order to transfer the respective test object 111, 112, 113, . . . , initially from the outer region (at atmospheric pressure) into the first vacuum chamber 110 (which serves, in this case, as an airlock chamber), and subsequently into the second vacuum chamber 120 (which is under vacuum conditions). In this case, the transporting devices 150, 160 may comprise, e.g., a gripper arm operated with robot assistance, said gripper arm engaging at a mount of the relevant test object (e.g., CGH).

During the operation of the apparatus as per FIG. 1, the first vacuum chamber 110 is pumped to the desired vacuum (e.g., to a pressure of less than 100 mbar, preferably less than 1 mbar) after transferring a "new" test object 111, 112, 113, . . . , to be tested into the first vacuum chamber 110 serving as an airlock chamber. After locking of the airlocks 114, 115, pumping times that are as short as possible, less than 10 minutes or in particular less than 1 minute (e.g., in each case until a pressure of 1 mbar is reached), are preferably realized in view of the sought-after high throughput.

In this case, commands for receiving a respective new test object 111, 112, 113, . . . are transmitted in computer-controlled fashion to the transporting devices 150, 160 as per FIG. 1. As a result, the relevant test object 111, 112, 113, . . . is then displaced to the (measurement) position within the test arrangement 130 following the appropriate command. Further commands are then transmitted to an exchange mechanism 140 then being driven to place the diffractive optical element 121, 122, 123, . . . , which is in each case suitable for testing the relevant test object, in the test arrangement 130. In embodiments, the supply chamber for storing the plurality of diffractive optical elements 121, 122, 123, . . . can also be arranged or integrated in the region of the exchange mechanism 140.

The invention inter alia also makes use of the circumstances that appropriate electric drives are commercially available for the above-described, comparatively moderate vacuum conditions and these can be placed into the first vacuum chamber 110 or into the second vacuum chamber 120 and can be driven by way of suitable vacuum lead-throughs without problems.

Preferably, the test objects 111, 112, 113, . . . are transferable into the respective measurement position within the test arrangement 130 and are able to be removed from this measurement position again without this leading to a collision with the respective diffractive optical element 121, 122, 123, . . . , this being realized by way of a lateral feed of the respective test object into the measurement position both according to FIG. 1 and according to FIG. 2. In this way, it is possible to test different test objects 111, 112, 113, . . . (for the measurement of which, e.g., one and the same diffractive optical element is suitable), without the diffractive optical element needing to be removed from the test arrangement 130 or 230.

The embodiment of FIG. 2 differs from the embodiment of FIG. 1 in that, in particular, the test arrangement 230 as per FIG. 2 is arranged in the first vacuum chamber 210 (which alternates between atmospheric pressure and vacuum conditions) and accordingly the test arrangement 230 likewise alternates between atmospheric pressure and vacuum conditions.

Further, in contrast to FIG. 1, only one transporting device 250 (symbolized by a double-headed arrow) is provided as per FIG. 2 for transporting the test objects 211, 212, 213, . . . from the outer region (at atmospheric pressure) into the first vacuum chamber 110 or 210. According to FIG. 2, the respective test object 211, 212, 213, . . . can be directly placed in the measurement position in the test arrangement 230 by way of this transporting device 250 (which may have a robot situated in atmospheric pressure, for example), whereupon there typically only still needs to be an adjustment of, e.g., a few micrometers (μm).

Here, the embodiment of FIG. 2 is advantageous over the embodiment of FIG. 1 in that even comparatively large and heavy test objects such as, e.g., EUV mirrors can be transferred directly from the outer region (at atmospheric pressure) into the respective measurement position using a single (e.g., rail-based) transport system. This is the case since, unlike in FIG. 1, there need not be further guidance of the test object through a further airlock to the test arrangement. By contrast, the evacuation of a volume of the vacuum chamber 210 receiving the test arrangement 230, which is larger in comparison with the volume of the vacuum chamber 110 from FIG. 1, is accepted.

Figure 3:
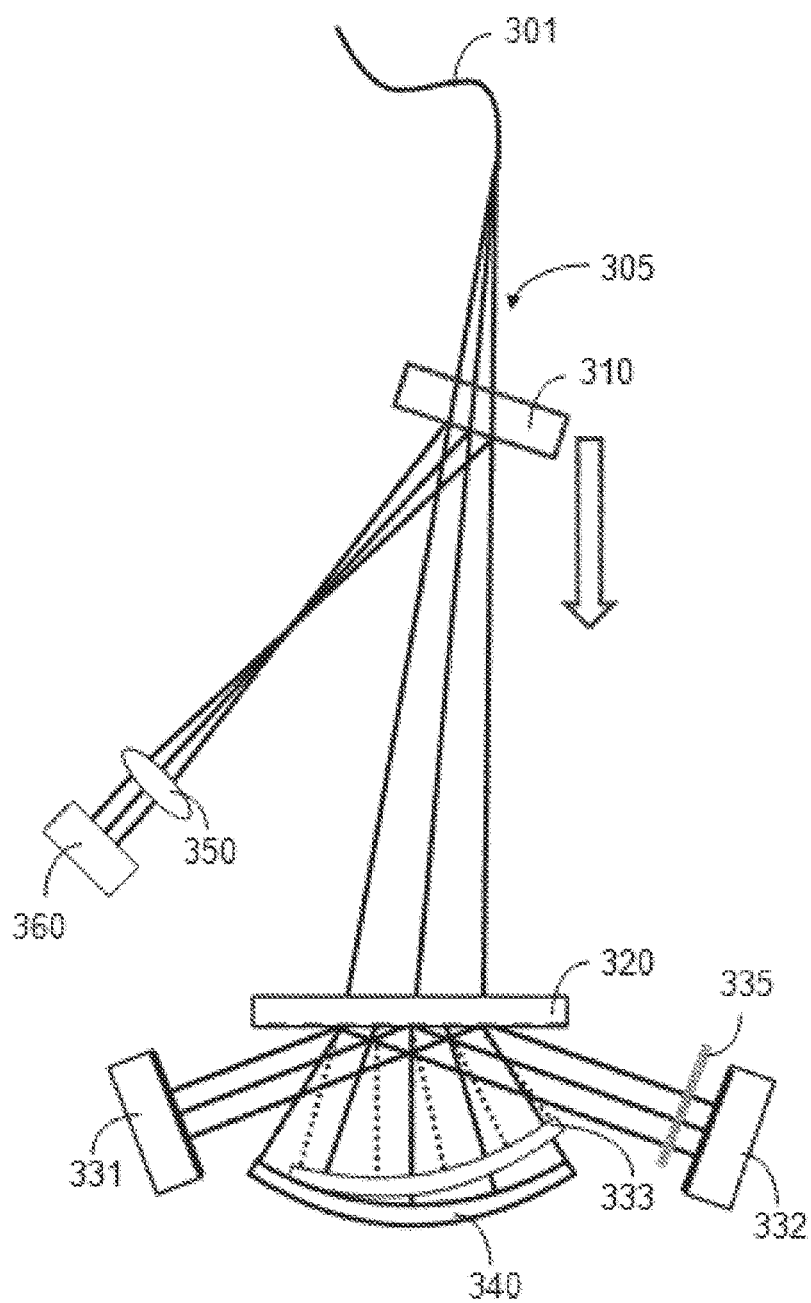
FIG. 3 shows a schematic illustration of a possible structure of an interferometric test arrangement.
Figure 4B:
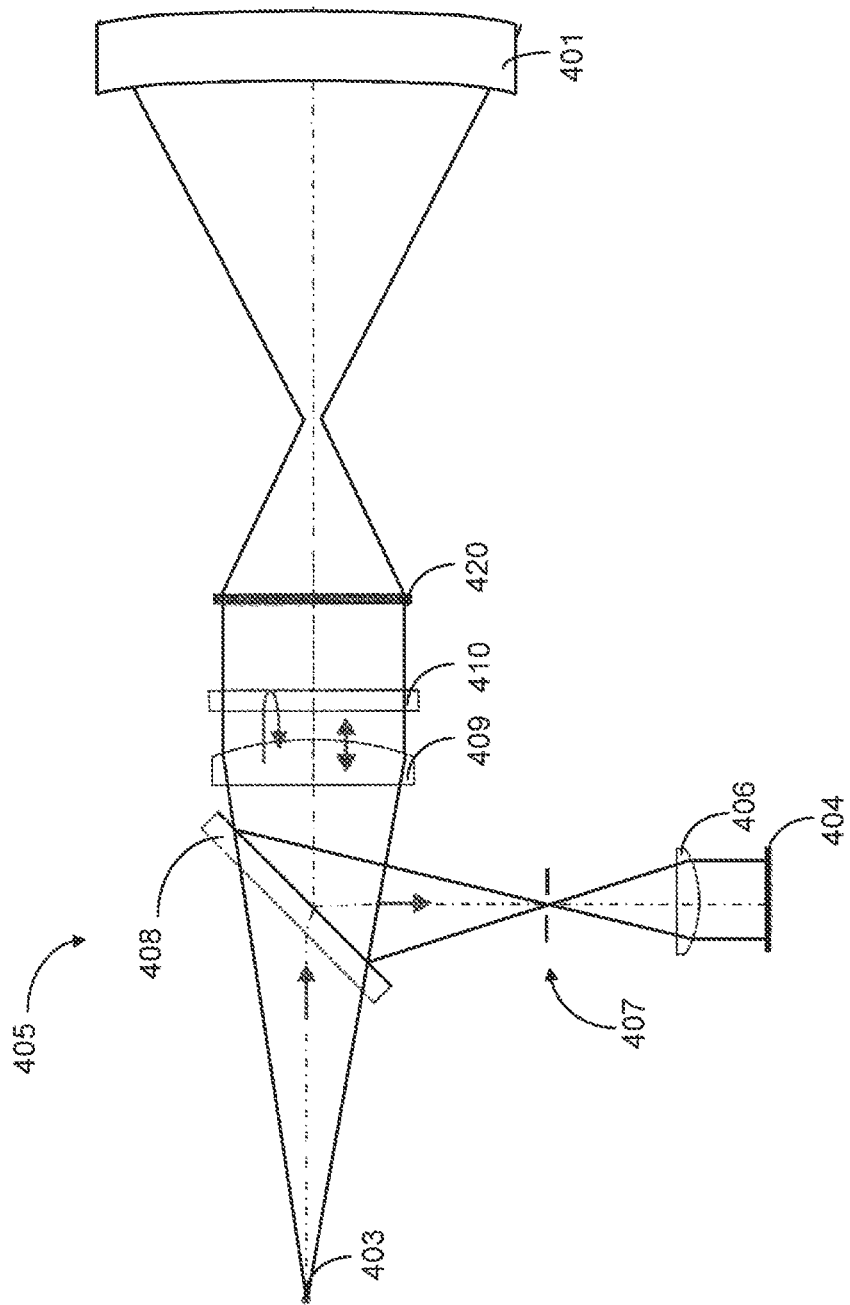

FIG. 3 and FIGS. 4A and 4B show schematic illustrations of exemplary possible realizations of the interferometric test arrangement 130 or 230 in the embodiments described above.

In accordance with FIG. 3, illumination radiation produced by a light source (not illustrated) and emerging from the exit surface of an optical waveguide 301 emerges as an input wave 305 having a spherical wavefront, passes through a beam splitter 310 and is then incident on a complexly coded CGH 320. The CGH 320 produces a total of four output waves from the input wave 305 in transmission in the example in accordance with its complex coding, one output wave of which impinges as a test wave on the surface of the test object in the form of a mirror 340 with a wavefront adapted to the target shape of the surface of said mirror 340. Furthermore, the CGH 320 produces three further output waves from the input wave 305 in transmission, each of which further output waves is incident on a respective further reflective optical element 331, 332 and 333. "335" denotes a shutter. The CGH 320 also serves for superimposing the test wave reflected from the test object or mirror 340 and the reference waves reflected from the elements 331-333, which are incident as convergent beams again on the beam splitter 310 and are reflected from the latter in the direction of an interferometer camera 360 designed as a CCD camera, in the course of which they pass through an eyepiece 350. The interferometer camera 360 captures an interferogram produced by the interfering waves, the actual shape of the optical surface of the test object 340 being determined from said interferogram by way of an evaluation device (not illustrated).

FIGS. 4A and 4B show schematic illustrations for explaining a further possible functional principle of an interferometric test arrangement for testing a mirror 401. As per FIG. 4A, an interferogram between a reference light (reference wave) that is reflected at a reference surface 410 ("Fizeau plate") and a measurement light (test wave) that is reflected at the mirror 401 is produced in a Fizeau arrangement. Here, the measurement light is formed into an aspherical wavefront by a computer-generated hologram (CGH) 420, said wavefront corresponding mathematically exactly to the "test object form" (i.e. the form of the relevant mirror 401) at an intended distance. The wavefronts reflected firstly by the reference surface 410 and secondly by the relevant mirror 401 or test object interfere with one another in an interferometer 405 (which is schematically illustrated by way of example in terms of its overall design in FIG. 4B), with a collimator 409, a beam splitter plate 408, a stop 407, an eyepiece 406 and a CCD camera 404 and a light source 403 for the interferometer 405 being depicted in FIG. 4B. An interferogram of the respective mirror is recorded by the CCD camera 404.

Even though the invention has been described on the basis of specific embodiments, numerous variations and alternative embodiments will be apparent to a person skilled in the art, for example through combination and/or exchange of features of individual embodiments. Accordingly, such variations and alternative embodiments are concomitantly encompassed by the present invention, and the scope of the invention is restricted only to limitations that fall within the meaning of the appended patent claims and equivalents thereof.

What is claimed is:

1. An apparatus for characterizing a surface shape of test objects, comprising:
   a test arrangement configured to determine the surface shape of the test objects using a test wave, the test wave having a wavefront produced by diffraction at one of at least two diffractive optical elements;
   a first vacuum chamber; and
   a second vacuum chamber;
   wherein the test arrangement is arranged within the first vacuum chamber;
   wherein the first vacuum chamber is configured to receive a test object for characterization of a surface shape of the test object by the apparatus; and
   wherein the second vacuum chamber comprises a supply chamber configured to store the at least two diffractive optical elements at vacuum when the first vacuum chamber receives the test object.

2. The apparatus as claimed in claim 1, wherein the second vacuum chamber is configured to maintain a vacuum state permanently during operation of the apparatus.

3. The apparatus as claimed in claim 2, wherein the first vacuum chamber is configured to alternate between a state with atmospheric pressure and a vacuum state during the operation of the apparatus.

4. The apparatus as claimed in claim 1, wherein the first vacuum chamber is configured to alternate between a state with atmospheric pressure and a vacuum state during operation of the apparatus.

5. The apparatus as claimed in claim 1, further comprising a first transporting device configured to transport the test object from a region outside the first vacuum chamber into the first vacuum chamber.

6. The apparatus as claimed in claim 1, wherein the first vacuum chamber and the second vacuum chamber are configured such that the first vacuum chamber receives the one of the at least two diffractive optical elements from the second vacuum chamber under vacuum conditions.

7. The apparatus as claimed in claim 1, further comprising an exchange mechanism configured to exchange ones of the at least two diffractive optical elements respectively situated in the test arrangement.

8. The apparatus as claimed in claim 1, wherein the diffractive optical elements are computer-generated holograms (CGH).

9. The apparatus as claimed in claim 1, wherein the diffractive optical elements contain quartz glass ($SiO_2$).

10. The apparatus as claimed in claim 1, wherein the test objects are optical elements.

11. The apparatus as claimed in claim 10, wherein the test objects are microlithographic optical elements.

12. The apparatus as claimed in claim 1, wherein the test objects are mirrors.

13. The apparatus as claimed in claim 12, wherein the test objects are mirrors configured for operation under extreme ultraviolet (EUV) wavelength conditions.

14. A vacuum chamber system configured into an apparatus as claimed in claim 1.

15. A method for characterizing the surface shape of a test object comprising:
    providing an apparatus as claimed in claim 1, and
    determining the surface shape of the test object.

\* \* \* \* \*